United States Patent
Shaw et al.

(10) Patent No.: US 8,430,027 B2
(45) Date of Patent: Apr. 30, 2013

(54) FRAME UNIT FOR TENSIONING A PRINTING SCREEN AND A JIG FOR FITTING A PRINTING SCREEN TO OR REMOVING A PRINTING SCREEN FROM A FRAME UNIT

(75) Inventors: Fraser Shaw, Troon (GB); James Graham Hall, Troon (GB); Richard Andre Piatek, Weymouth (GB); Lesley Piatek, legal representative, Weymouth (GB)

(73) Assignee: DEK International GmbH, Zurich (CH)

( * ) Notice: Subject to any disclaimer, the term of this patent is extended or adjusted under 35 U.S.C. 154(b) by 774 days.

(21) Appl. No.: 10/595,704

(22) PCT Filed: Nov. 4, 2004

(86) PCT No.: PCT/GB2004/004677
§ 371 (c)(1),
(2), (4) Date: Oct. 8, 2007

(87) PCT Pub. No.: WO2005/046994
PCT Pub. Date: May 26, 2005

(65) Prior Publication Data
US 2008/0216681 A1    Sep. 11, 2008

(30) Foreign Application Priority Data
Nov. 7, 2003  (GB) .................................. 0326065.0

(51) Int. Cl.
    *B05C 17/06* (2006.01)
(52) U.S. Cl.
    USPC ... 101/127.1; 38/102.1; 38/102.3; 38/102.91; 160/376; 160/378

(58) Field of Classification Search .................. 101/127, 101/127.1, 128.1; 38/102.1, 102.2, 102.3, 38/102.4, 102.5, 102.91; 160/376, 378, 379, 160/380
See application file for complete search history.

(56) References Cited

U.S. PATENT DOCUMENTS 4,404,962 A * 9/1983 Zinn et al. ..................... 126/676
4,409,749 A   10/1983 Hamu
(Continued)

FOREIGN PATENT DOCUMENTS

| CN | 1222447 | 7/1999 |
|---|---|---|
| GB | 2317366 | 3/1998 |
| GB | 2 388 073 | 5/2003 |

*Primary Examiner* — Ren Yan
(74) *Attorney, Agent, or Firm* — Renner, Otto, Boisselle & Sklar, LLP (57) ABSTRACT

A frame unit for tensioning a printing screen, the frame unit comprising a frame including at least one frame member, the at least one frame member comprising: a supporting frame element; at least one engagement element for engaging a fitted printing screen to tension the same, wherein the at least one engagement element comprises a body which is pivotally coupled to the supporting frame element such that the at least one engagement element is pivotable in one, tensioning sense to tension a fitted printing screen and the other, opposite sense to adopt a configuration in which a printing screen can be fitted to or removed from the frame unit, a first, engagement arm extending from the body for engaging a fitted printing screen, and a second, biasing arm extending from the body to which a biasing force is applied to bias the at least one engagement element to pivot in the tensioning sense; and at least one biasing element operative to apply a biasing force to the biasing arm of the at least one engagement element to bias the at least one engagement element to pivot in the tensioning sense and tension a fitted printing screen.

49 Claims, 9 Drawing Sheets

U.S. PATENT DOCUMENTS

| | | |
|---|---|---|
| 4,442,772 A | 4/1984 | Bubley et al. |
| 4,580,361 A * | 4/1986 | Hillstrom et al. ............... 40/603 |
| 5,606,911 A | 3/1997 | Cane |
| 5,606,912 A | 3/1997 | Cane |
| 5,941,171 A | 8/1999 | Fromm |
| 5,979,313 A | 11/1999 | Fromm et al. |
| 6,038,969 A | 3/2000 | Podlipec et al. |
| 6,067,903 A | 5/2000 | Williams |
| 6,289,804 B1 | 9/2001 | Williams |
| 6,588,334 B2 * | 7/2003 | Salisbury ................... 101/127.1 |

* cited by examiner

FRAME UNIT FOR TENSIONING A PRINTING SCREEN AND A JIG FOR FITTING A PRINTING SCREEN TO OR REMOVING A PRINTING SCREEN FROM A FRAME UNIT

This application is a national phase of International Application No. PCT/GB2004/004677 filed Nov. 4, 2004 and published in the English language.

BACKGROUND OF THE INVENTION

1. Field of the Invention

The present invention relates to a frame unit for tensioning a printing screen, often alternatively referred to as a printing stencil, for use in a screen printing machine, and a jig for fitting a printing screen to or removing a printing screen from a frame unit.

A printing screen, typically comprising a screen sheet formed of a metal or plastic, includes apertures which define the pattern to be printed, with the screen being located over an object to be printed and printing medium forced through the apertures to provide the required print.

2. Description of Related Art

In order to produce high-quality prints, printing screens have to be held under tension. Numerous frame units have been developed which allow for the tensioning of printing screens, with examples being disclosed in U.S. Pat. No. 5,606,911, U.S. Pat. No. 5,606,912, U.S. Pat. No. 5,941,171, U.S. Pat. No. 6,038,969, U.S. Pat. No. 6,067,903 and U.S. Pat. No. 6,289,804.

Whilst these existing frame units all provide for the tensioning of printing screens, the frame units suffer from a number of drawbacks, in particular in requiring the printing screens to include stress-relieving features to enable the uniform tensioning of the printing screens, and in being of relatively complicated construction and thus relatively high cost. The application of a uniform tension over a printing screen is particularly important in order to obtain a high-quality print, as an uneven tension can lead to rippling of the screen sheet of the printing screen, which rippling results in poor-quality printing. The existing frame units utilize continuous rigid members to apply tensioning forces to the edges of a printing screen, but these members, in being rigid, and as a consequence of manufacturing tolerances, apply slightly different tensions at the points of attachment along the edges of the printing screens.

BRIEF SUMMARY OF THE INVENTION

It is an aim of the present invention to provide an improved frame unit for tensioning printing screens, which in its preferred embodiment provides both for improved tensioning of printing screens, thereby not essentially requiring the printing screens to include stress-relieving features, and simpler fabrication, leading to a lower cost unit.

It is a further aim of the present invention to provide a jig for fitting a printing screen to or removing a printing screen from a frame unit.

In one aspect the present invention provides a frame unit for tensioning a printing screen, the frame unit comprising a frame including at least one frame member, the at least one frame member comprising: a supporting frame element; at least one engagement element for engaging a fitted printing screen to tension the same, wherein the at least one engagement element comprises a body which is pivotally coupled to the supporting frame element such that the at least one engagement element is pivotable in one, tensioning sense to tension a fitted printing screen and the other, opposite sense to adopt a configuration in which a printing screen can be fitted to or removed from the frame unit, a first, engagement arm extending from the body for engaging a fitted printing screen, and a second, biasing arm extending from the body to which a biasing force is applied to bias the at least one engagement element to pivot in the tensioning sense; and at least one biasing element operative to apply a biasing force to the biasing arm of the at least one engagement element to bias the at least one engagement element to pivot in the tensioning sense and tension a fitted printing screen.

Preferably, the supporting frame element comprises an extruded section.

Preferably, the at least one engagement element comprises an extruded section.

Preferably, the supporting frame element includes a cavity along a length thereof in which the at least one engagement element is disposed.

Preferably, the supporting frame element includes a recess in a surface thereof into which the at least one engagement element extends for receiving an engagement member at a respective edge of a fitted printing screen.

Preferably, the supporting frame element includes one of a pivot projection or a pivot recess extending along a length thereof and the at least one engagement element includes the other of a pivot recess or a pivot projection extending along a length thereof which engages the one of the pivot projection or the pivot recess of the supporting frame element.

More preferably, the one of the pivot projection or the pivot recess of the supporting frame element and the other of the pivot recess or the pivot projection of the at least one engagement element are captively engaged.

Preferably, the at least one biasing element provides a permanent biasing force.

Preferably, the at least one biasing element comprises a resilient element.

Preferably, the at least one frame member comprises: a plurality of biasing elements for biasing the at least one engagement element.

Preferably, the at least one frame member comprises: a plurality of engagement elements disposed along a length of the supporting frame element.

In one embodiment each engagement element is biased by at least one biasing element.

Preferably, the engagement elements are juxtaposed in end-to-end relation along a length of the supporting frame element.

Preferably, the frame includes a mounting surface by which the frame unit is mounted to a screen printing machine. In a preferred embodiment the mounting surface is parallel to the plane of a fitted printing screen.

Preferably, the at least one biasing element is configured to apply a biasing force to the biasing arm of the at least one engagement element in a direction substantially orthogonal to the mounting surface.

Preferably, the engagement arm of the at least one engagement element extends substantially orthogonally to the mounting surface.

Preferably, the biasing arm of the at least one engagement element has a principal component extending parallel to the mounting surface.

More preferably, the biasing arm of the at least one engagement element extends in a direction towards an outer edge of the supporting frame element.

In one embodiment the supporting frame element includes at least one aperture into which at least one engagement member can be inserted to engage the biasing arm of the at least one engagement element to pivot the at least one engagement element in the other sense to adopt a configuration in which a printing screen can be fitted to or removed from the frame unit.

In another embodiment the at least one frame member further comprises: a counter-biasing element operative to apply a counter-biasing force to the at least one engagement element to overcome the biasing force of the at least one biasing element and pivot the at least one engagement element in the other sense to adopt a configuration in which a printing screen can be fitted to or removed from the frame unit.

Preferably, the at least one counter-biasing element comprises an expandable member.

More preferably, the at least one counter-biasing element comprises an inflatable bladder.

In one embodiment the at least one counter-biasing element is configured to apply a counter-biasing force to a side of the biasing arm of the at least one engagement element opposite to which the biasing force is applied by the at least one biasing element.

In another embodiment the at least one engagement element further comprises a third, operating arm to which a counter-biasing force is applied by the at least one counter-biasing element to overcome the biasing force of the at least one biasing element and pivot the at least one engagement element in the other sense to adopt a configuration in which a printing screen can be fitted to or removed from the frame unit.

Preferably, the operating arm of the at least one engagement element has a principal component extending parallel to the mounting surface.

More preferably, the operating arm of the at least one engagement element extends in a direction towards an inner edge of the supporting frame element.

Preferably, the at least one frame member comprises an elongate member.

Preferably, the frame is substantially rectangular in shape.

Preferably, the frame includes a plurality of frame members.

More preferably, the frame includes at least one pair of frame members disposed in opposed relation.

Yet more preferably, the frame comprises first and second pairs of frame members each disposed in opposed relation.

Still more preferably, respective ends of the frame members are connected by corner pieces.

In a preferred embodiment the at least one counter-biasing element of each frame member is provided by a single, common counter-biasing element.

The present invention also extends to the above-described frame unit in combination with a printing screen.

In another aspect the present invention provides a jig for fitting a printing screen to or removing a printing screen from a frame unit comprising at least one engagement element for engaging a fitted printing screen in tensioning the same and at least one biasing element for applying a biasing force to the at least one engagement element to bias the at least one engagement element in a tensioning sense to tension a fitted printing screen, the jig comprising: at least one engagement member for engaging the at least one engagement element, such that, when the frame unit is mounted to the jig, the at least one engagement member is operative to move the at least one engagement element against the biasing force of the at least one biasing element to adopt a configuration in which a printing screen can be fitted to or removed from the frame unit.

Preferably, the at least one engagement member comprises a fixed member which acts, on mounting the frame unit to the jig, to move the at least one engagement element against the biasing force of the at least one biasing element to adopt a configuration in which a printing screen can be fitted to or removed from the frame unit.

Preferably, the jig further comprises: at least one clamp for mounting the frame unit to the jig.

BRIEF DESCRIPTION OF THE SEVERAL VIEWS OF THE DRAWINGS

Preferred embodiments of the present invention will now be described hereinbelow by way of example only with reference to the accompanying drawings, in which.

DETAILED DESCRIPTION OF THE INVENTION

FIGS. 1 to 4 illustrate a frame unit 1 for tensioning a printing screen 3 in accordance with a first embodiment of the present invention.

In this embodiment the printing screen 3 comprises a screen sheet 4, typically formed of a metal or plastic, which includes a pattern of apertures through which a printing medium is printed, and engagement members 5 at each of the edges of the screen sheet 4 by which the screen 3 is tensioned. GB-A-2388073 discloses examples of such printing screens.

The frame unit 1 comprises first, second, third and fourth frame members 6a-d, in this embodiment elongate members, for engaging respective edges of the screen 3, and first, second, third and fourth corner pieces 7a-d connecting the respective ends of the frame members 6a-d. In this embodiment the frame members 6a-d are connected to the corner pieces 7a-d by screws, but in an alternative embodiment the frame members 6a-d and the corner pieces 7a-d could be configured to be a press-fit connection.

The frame members 6a-d each comprise a frame element 9, which frame elements 9 are connected to the respective corner pieces 7a-d, in this embodiment by screws, such as to define a rigid frame, a plurality of engagement elements 11 for engaging a respective edge of the screen 3, in this embodiment through the engagement member 5 at the respective edge of the screen 3, which engagement elements 11 are pivotally coupled to the frame element 9 such as to be pivotable in one, tensioning sense to tension the screen 3 and the other, opposite sense to allow for fitting and removal of the screen 3, and a plurality of biasing elements 17 for applying a biasing force to respective ones of the engagement elements 11, which biasing force acts to bias the engagement elements 11 to pivot in the tensioning sense and apply a tension to the respective edge of the screen 3. In this embodiment the provision of a plurality of engagement elements 11 for engagement with each edge of the screen 3 facilitates the application of a controlled tension across the length of each edge of the screen 3. In addition, the provision of a plurality of engagement elements 11 for engagement with each edge of the screen 3 allows for each edge of the screen 3 to be tensioned with a predeterminable tension profile, for example, to a higher tension at the respective ends.

Figure 4:
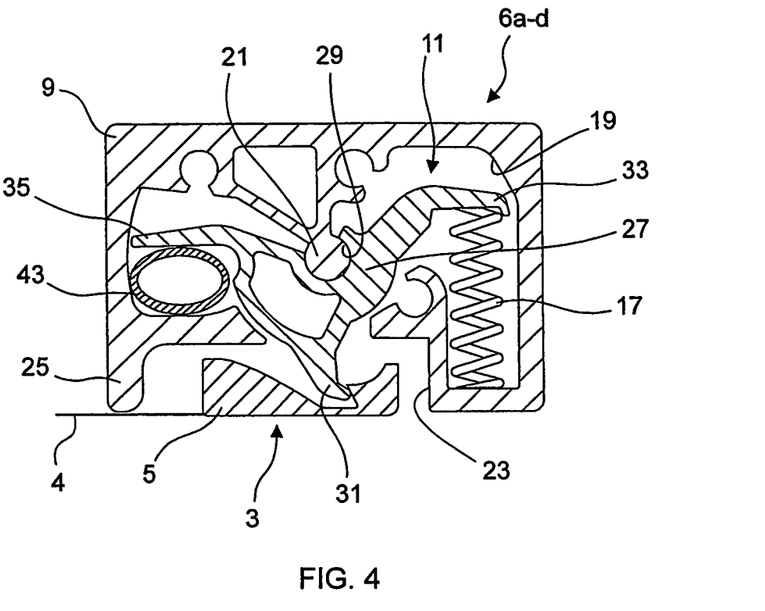
FIG. 4 illustrates a vertical sectional view through a frame member of the frame unit of FIG. 1.

Each of the frame elements 9 includes a central, elongate cavity 19 in which the respective engagement elements 11 are disposed along the length thereof, and a pivot bead 21, in this embodiment a part-circular bead, which extends along the length of the cavity 19 to which the respective engagement elements 11 are pivotally hinged, as will be described in more detail hereinbelow. In this embodiment the engagement elements 11 of each frame member 6a-d are juxtaposed in end-to-end relation. In an alternative embodiment the engagement elements 11 of each frame member 6a-d could be disposed in spaced relation.

Each of the frame elements 9 further includes an elongate, screen recess 23 at a lower, mounting surface for receiving the engagement member 5 at the respective edge of the screen 3 and into which the respective engagement elements 11 extend to engage the engagement member 5, and a guide 25 at an inner edge over which the sheet 4 of the screen 3 is tensioned.

In this embodiment the frame elements 9 are fabricated from an extrusion, here an aluminum extrusion, with the extrusion being sectioned at the required lengths.

Each of the engagement elements 11 comprises a body 27 which includes a pivot recess 29, in this embodiment a part-circular recess, which extends along the length thereof and in which the pivot bead 21 of the respective frame element 9 is held captive, whereby the engagement elements 11 are captively pivotable to the respective frame elements 9.

Each of the engagement elements 11 further includes a first, engagement arm 31 which extends into the screen recess 23 in the respective frame element 9 for engagement with the engagement member 5 at the respective edge of the screen 3. In this embodiment the engagement arm 31 extends substantially orthogonally to the lower, mounting surface of the respective frame element 9. In this embodiment the engagement arm 31 comprises a continuous bar, but in other embodiments can have any desired form, for example, as a comb structure for engaging slots at the respective edge of a printing screen.

Each of the engagement elements 11 further includes a second, biasing arm 33 which is engaged by respective ones of the biasing elements 17, in this embodiment by a pair of the biasing elements 17, such as to bias the engagement element 11 to pivot in the tensioning sense, whereby the distal end of the engagement arm 31 is biased in a direction outwardly from the inner edge of the respective frame element 9 to tension the respective edge of the screen 3. In this embodiment the biasing arm 33 extends substantially parallel to the lower, mounting surface of the respective frame element 9 in a direction towards the outer edge of the respective frame element 9. In this embodiment the biasing elements 17 are configured to apply a biasing force to the biasing arm 33 in a direction substantially orthogonal to the lower mounting surface of the respective frame element 9.

Each of the engagement elements 11 further includes a third, operating arm 35 which allows for operation of the engagement elements 11 to enable the fitting of the screen 3, as will be described in more detail hereinbelow. In this embodiment the operating arm 35 extends substantially parallel to the lower, mounting surface of the respective frame element 9 in a direction towards the inner edge of the respective frame element 9.

In this embodiment the engagement elements 11 are fabricated from an extrusion, here an aluminum extrusion, with the extrusion being sectioned at the required lengths.

Figure 1:
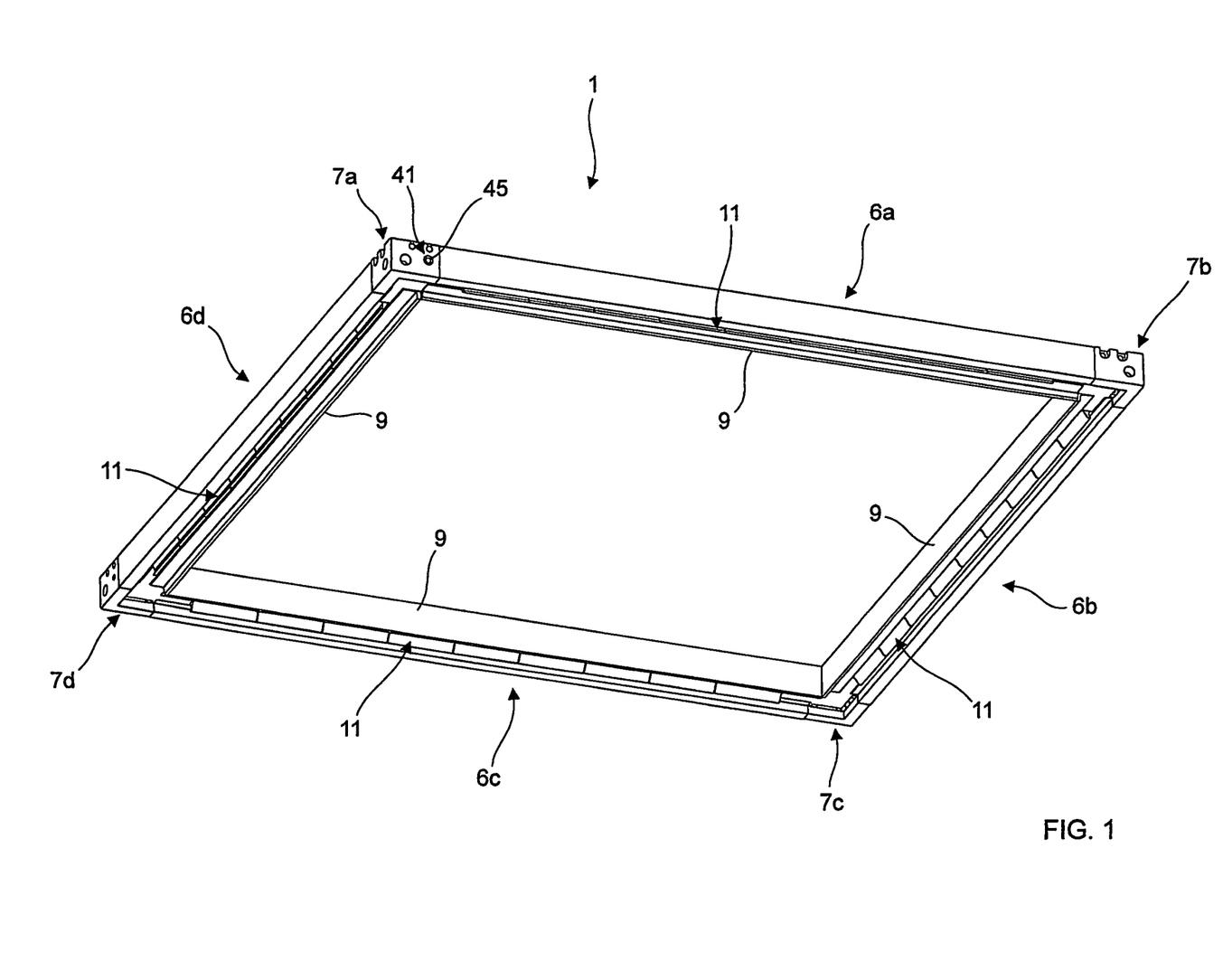
FIG. 1 illustrates a perspective view from below of a frame unit for tensioning a printing screen in accordance with a first embodiment of the present invention.
Figure 2:
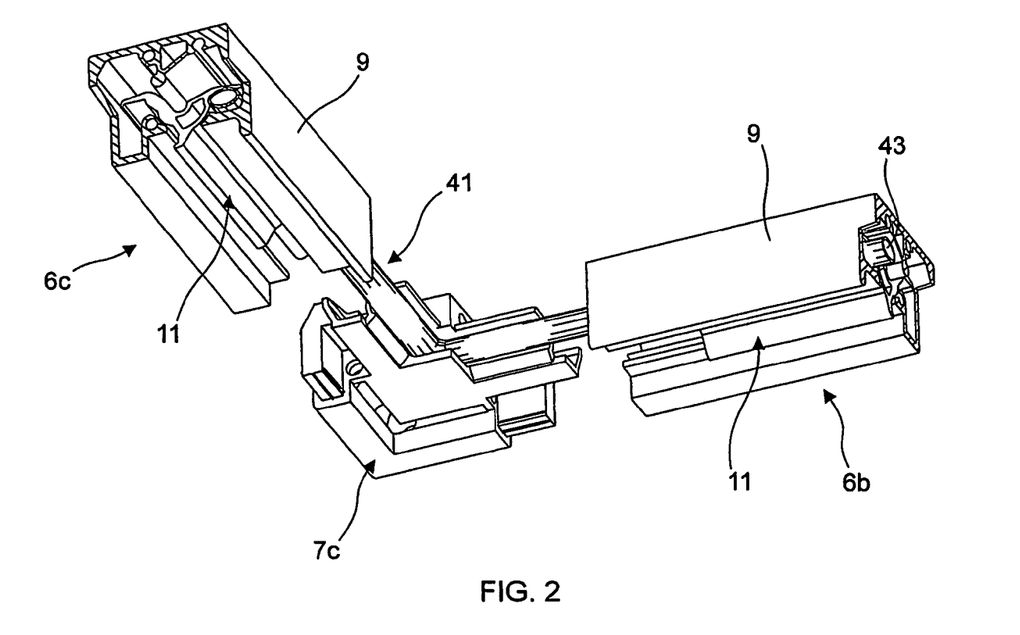
FIG. 2 illustrates in enlarged scale a fragmentary, exploded perspective view from below of one corner of the frame unit of FIG. 1.
Figure 3:
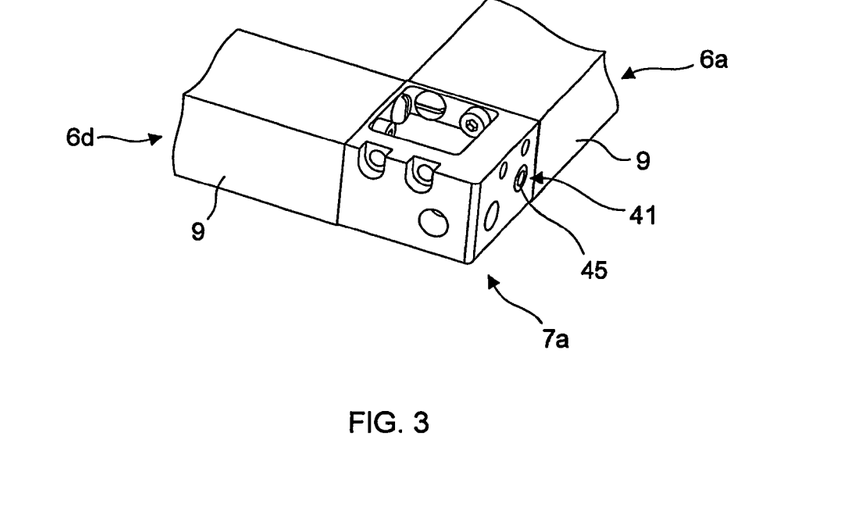
FIG. 3 illustrates in enlarged scale a fragmentary perspective view from above of one corner of the frame unit of FIG. 1.

The frame unit 1 further comprises a counter-biasing element 41 which is operable, in this embodiment commonly, to engage the operating arms 35 of each of the engagement elements 11 to apply a counter-biasing force to the operating arms 35 to counter-bias the engagement elements 11 to overcome the normal biasing force of the biasing elements 17 and cause the engagement elements 11 to adopt a configuration in which the screen 3 can be fitted to or removed from the frame unit 1. In this embodiment the counter-biasing element 41 comprises a single elongate inflatable bladder 43, here a pneumatic bladder, which is threaded through the central cavities 19 of the frame elements 9 adjacent the operating arms 35 of the engagement elements 11 and through the corner pieces 7a-d, as illustrated in FIG. 2, and a fluid connector 45, here a quick-fit pneumatic connector, which is connected to one end of the bladder 43 such as to allow for inflation and deflation of the bladder 43 by a separate actuator (not illustrated), with the other end of the bladder 43 being closed. In this embodiment the fluid connector 45 is mounted in one of the corner blocks 7a-d, here the first corner block 7a. In this embodiment the counter-biasing element 41 is configured to apply a counter-biasing force to the operating arms 35 in a direction substantially orthogonal to the lower, mounting surface of the respective frame elements 9.

The fitting of a printing screen 3 to the frame unit 1 will now be described hereinbelow with reference to FIGS. 5(*a*) to (*d*). In fitting a printing screen 3 to the frame unit 1, the frame unit 1 is required to be inverted from its normal operational orient, though the frame unit 1 could be utilized in the inverted state, and thus FIGS. 5(*a*) to (*d*) illustrate the frame unit 1 in the inverted state.

Figures 5A, 5B, 5C, 5D:
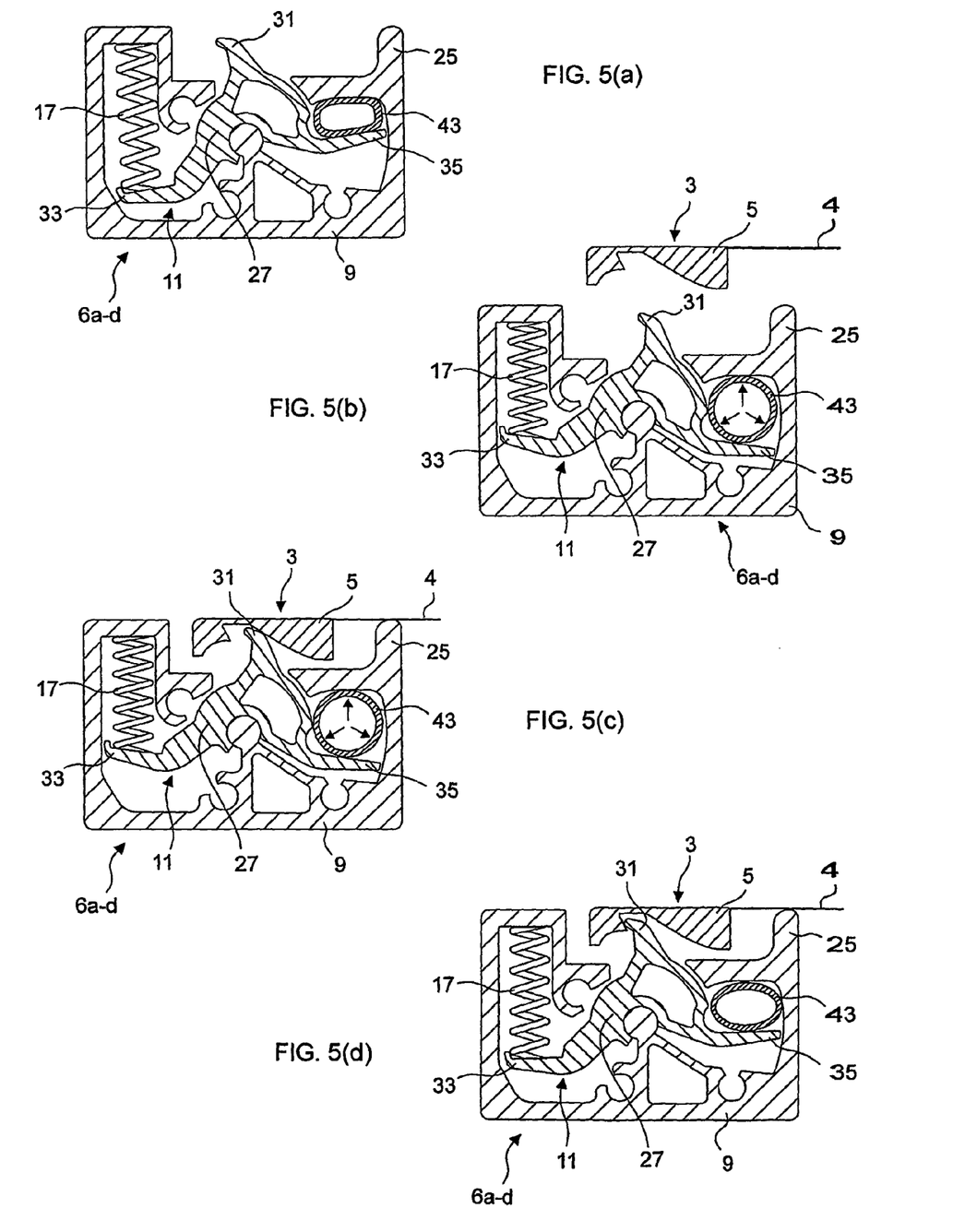
FIGS. 5(a) to (d) illustrate the operation of the frame unit of FIG. 1 when fitting a printing screen thereto.

From the normal, rest configuration of the frame unit 1, as illustrated in FIG. 5(*a*), the counter-biasing element 41 is actuated, in this embodiment by inflating the bladder 43, so as to apply a counter-biasing force to the operating arms 35 of the engagement elements 11 to counter-bias the engagement elements 11 to overcome the normal biasing force of the biasing elements 17 and cause the engagement elements 11 to adopt a configuration in which a printing screen 3 can be fitted to the frame unit 1, as illustrated in FIG. 5(*b*).

As illustrated in FIG. 5(*c*), the screen 3 is then located in position on the frame unit 1, in this embodiment with the engagement members 5 at the edges of the screen 3 being located in the screen recesses 23 in the frame elements 9 of the respective frame members 6a-d.

Following the positioning of the screen 3, the counter-biasing element 41 is de-actuated, in this embodiment by deflating the bladder 43, which de-actuation causes the engagement elements 11 to be pivoted by the biasing force of the biasing elements 17 in the tensioning sense, such as to tension the respective edges of the screen 3, as illustrated in FIG. 5(*d*).

The removal of a printing screen 3 from the frame unit 1 will now be described hereinbelow with reference to FIGS. 6(a) to (d). In removing a printing screen 3 from the frame unit 1, the frame unit 1 is required to be inverted from its normal operational orient, and thus FIGS. 6(a) to (d) illustrate the frame unit 1 in the inverted state.

Figures 6A, 6B, 6C, 6D:
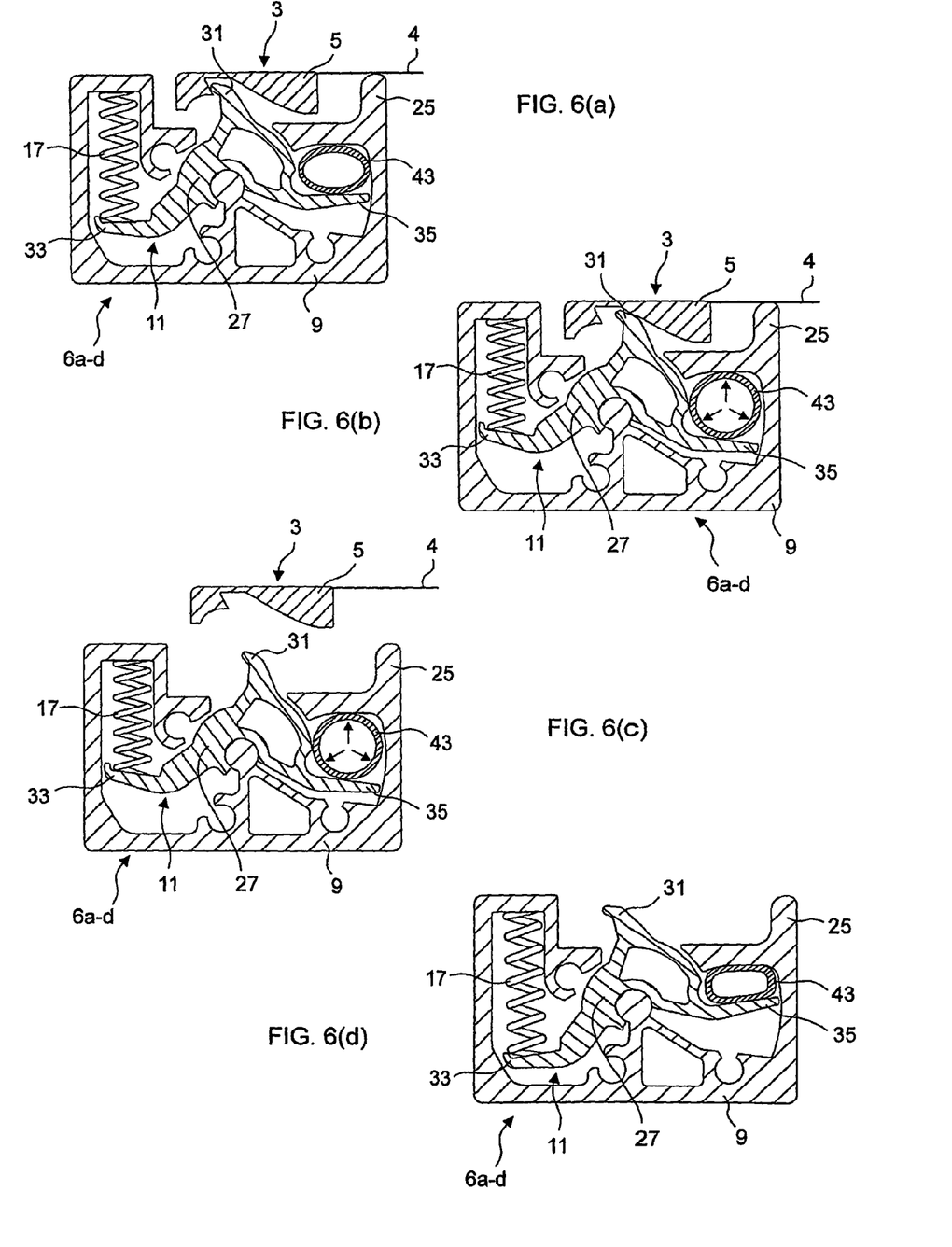
FIGS. 6(a) to (d) illustrate the operation of the frame unit of FIG. 1 when removing a printing screen therefrom.

From the fitted configuration in which a printing screen 3 is fitted to the frame unit 1, as illustrated in FIG. 6(a), the counter-biasing element 41 is actuated, in this embodiment by inflating the bladder 43, so as to apply a counter-biasing force to the operating arms 35 of the engagement elements 11 to counter-bias the engagement elements 11 to overcome the normal biasing force of the biasing elements 17 and cause the engagement elements 11 to adopt a configuration in which the screen 3 can be removed from the frame unit 1, as illustrated in FIG. 6(b).

As illustrated in FIG. 6(c), the screen 3 is then removed from the frame unit 1.

Following removal of the screen 3, the counter-biasing element 41 is de-actuated, in this embodiment by deflating the bladder 43, which de-actuation causes the engagement elements 11 to be pivoted by the biasing force of the biasing elements 17 to the normal, rest configuration, as illustrated in FIG. 6(d). Where another printing screen 3 is to be fitted to the frame unit 1, that printing screen 3 is located in position on the frame unit 1 in the manner described hereinabove before de-actuation of the counter-biasing element 41.

Figure 7:
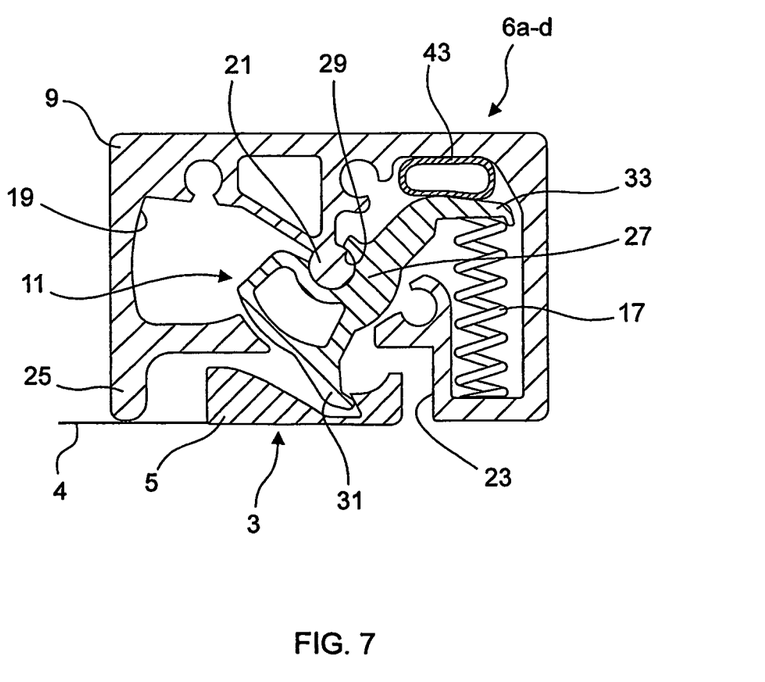
FIG. 7 illustrates a vertical sectional view through a frame member of a frame unit in accordance with a second embodiment of the present invention.

FIG. 7 illustrates a frame unit 1 for tensioning a printing screen 3 in accordance with a second embodiment of the present invention.

The frame unit 1 of this embodiment is very similar to that of the above-described first embodiment, and thus, in order to avoid unnecessary duplication of description, only the differences will be described in detail, with like parts being designated by like reference signs.

The frame unit 1 of this embodiment differs from that of the above-described first embodiment in that the engagement elements 11 do not include an operating arm 35, and in that the counter-biasing element 41 is disposed adjacent the biasing arm 33 to the side opposite the biasing elements 17.

Operation of the frame unit 1 of this embodiment is the same as for the above-described first embodiment.

Figure 8:
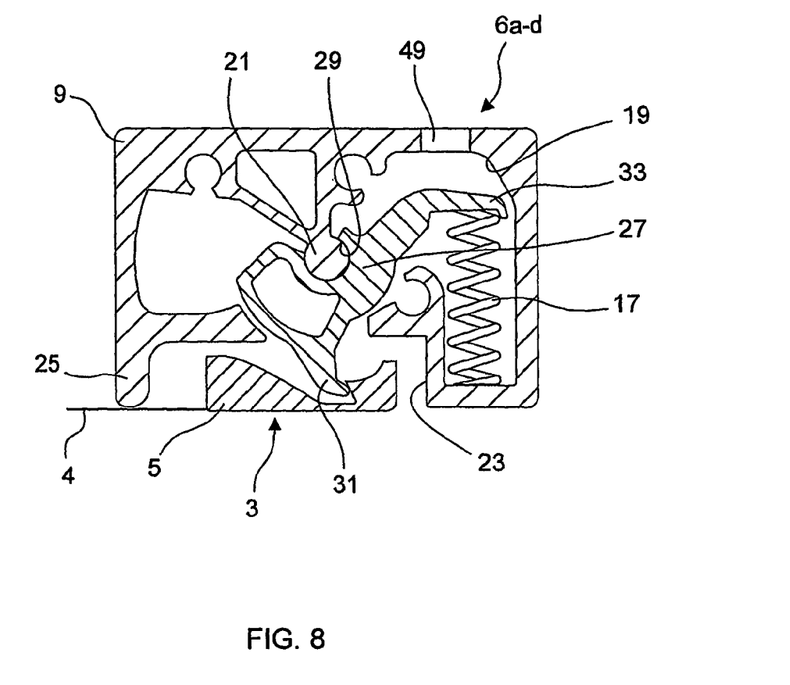
FIG. 8 illustrates a vertical sectional view through a frame member of a frame unit in accordance with a third embodiment of the present invention.

FIG. 8 illustrates a frame unit 1 for tensioning a printing screen 3 in accordance with a third embodiment of the present invention.

The frame unit 1 of this embodiment is very similar to that of the above-described first embodiment, and thus, in order to avoid unnecessary duplication of description, only the differences will be described in detail, with like parts being designated by like reference signs.

The frame unit 1 of this embodiment differs from that of the above-described first embodiment in that the engagement elements 11 do not include an operating arm 35, in omitting the counter-biasing element 41 and in that each of the frame elements 9 includes at least one aperture 49 in a lower surface thereof to allow access to the biasing arms 33 of the engagement elements 11.

In this embodiment the frame elements 9 each include a plurality of apertures 49, here as slots, along the length thereof in registration with respective ones of the engagement elements 11, such as to allow engagement members 53 of a jig 51 to act upon the engagement elements 11, as will be described in more detail hereinbelow.

In an alternative embodiment the frame elements 9 could include any number and arrangement of apertures 49 which allow for the engagement members 53 of a jig 51 to act upon the engagement elements 11. In one embodiment at least ones of the apertures 49 could span a plurality of engagement elements 11, such that one engagement member 53 could act on the plurality of engagement elements 11. For example, each of the apertures 49 could span the adjacent ends of two engagement elements 11.

In this embodiment the engagement elements 11 are counter-biased to adopt a configuration in which the screen 3 can be fitted to or removed from the frame unit 1 by use of a jig 51 to which the frame unit 1 is mounted.

Figure 9:
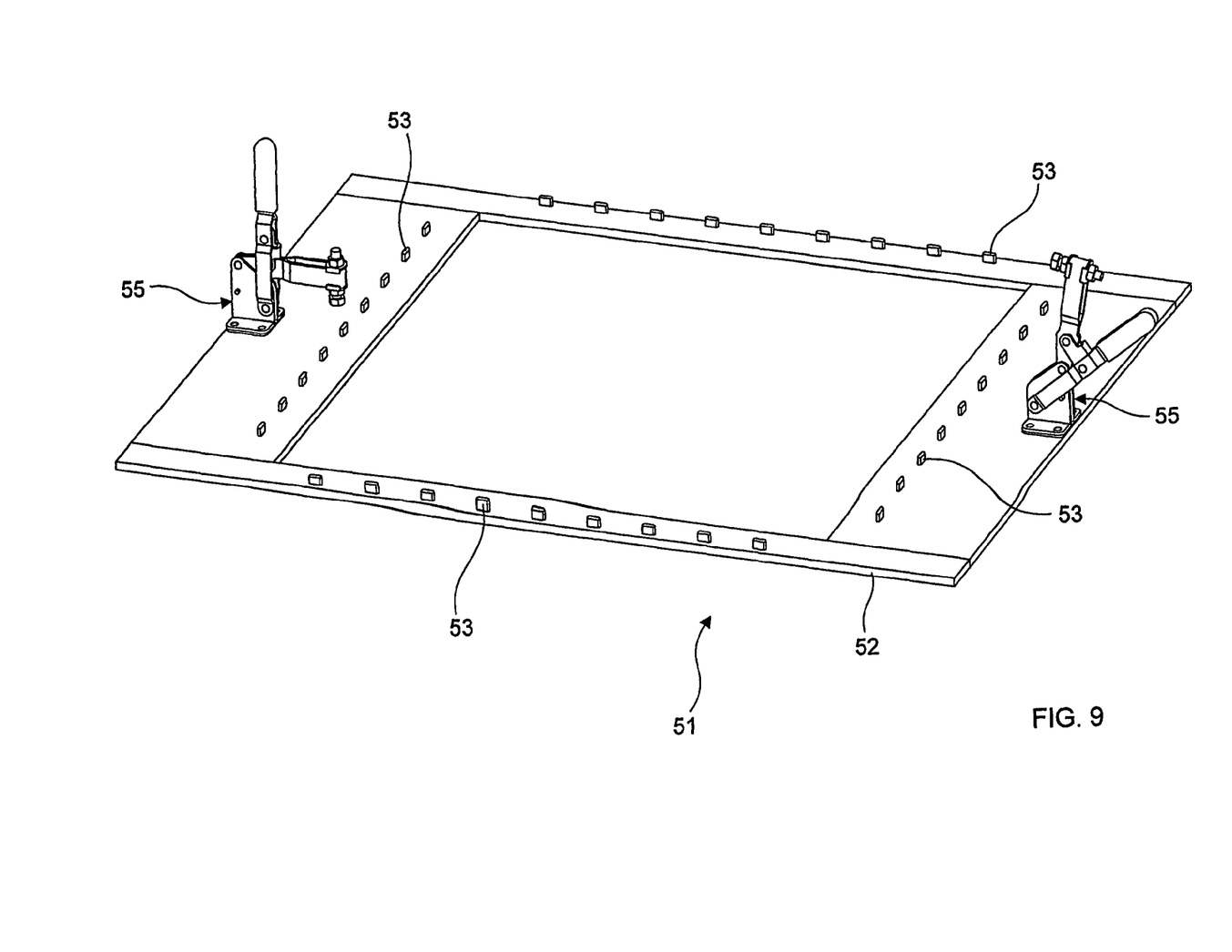
FIG. 9 illustrates a jig for fitting a printing screen to or removing a printing screen from a frame unit in accordance with one embodiment of the present invention.

FIG. 9 illustrates a jig 51 for fitting the screen 3 to or removing the screen 3 from the frame unit 1 in accordance with one embodiment of the present invention.

In this embodiment the jig 51 comprises a supporting member 52, here a frame of rectangular shape counterpart to the frame unit 1, and a plurality of engagement members 53 which are configured to engage the biasing arms 33 of respective ones of the engagement elements 11, such that, when the frame unit 1 is mounted to the jig 51, the engagement members 53 act to pivot the engagement elements 11 against the biasing force of the biasing elements 17 to adopt a configuration in which the screen 3 can be fitted to or removed from the frame unit 1. In an alternative embodiment the supporting member 52 could comprise a plate.

In this embodiment the engagement members 53 are fixed pins, and the frame unit 1 is clamped to the jig 51 by means of clamps 55 at opposed edges of the supporting member 52. In this embodiment the clamps 55 comprise thumb-screw clamps which are hinged to opposed edges of the supporting member 52. In one embodiment the clamps 55 could comprise toggle clamps. In a preferred embodiment the clamps 55 could be cammed such as to allow for a controlled tensioning/de-tensioning of the frame unit 1 from the jig 51, thereby ensuring a uniform tensioning of the screen 3 on fitting and a uniform release of tension from the screen 3 on release. In one embodiment the clamps 55 could be operably coupled such that at least ones of the clamps 55 are operated in unison, thereby again providing for a smooth operation of the clamping arrangement.

In an alternative embodiment the engagement members 53 could be configured such as to be movable and actuatable between a first, non-actuated position in which the frame unit 1 can be clamped to the jig 51, and a second, actuated position in which the engagement members 53 engage the biasing arms 33 of respective ones of the engagement elements 11 and pivot the engagement elements 11 against the biasing force of the biasing elements 17 to adopt a configuration in which the screen 3 can be fitted to or removed from the frame unit 1.

The fitting of a printing screen 3 to the frame unit 1 will now be described hereinbelow with reference to FIGS. 10(a) to (d). In fitting a printing screen 3 to the frame unit 1, the frame unit 1 is required to be inverted from its normal operational orient, though the frame unit 1 could be utilized in the inverted state, and thus FIGS. 10(a) to (d) illustrate the frame unit 1 in the inverted state.

Figures 10A, 10B, 10C, 10D:
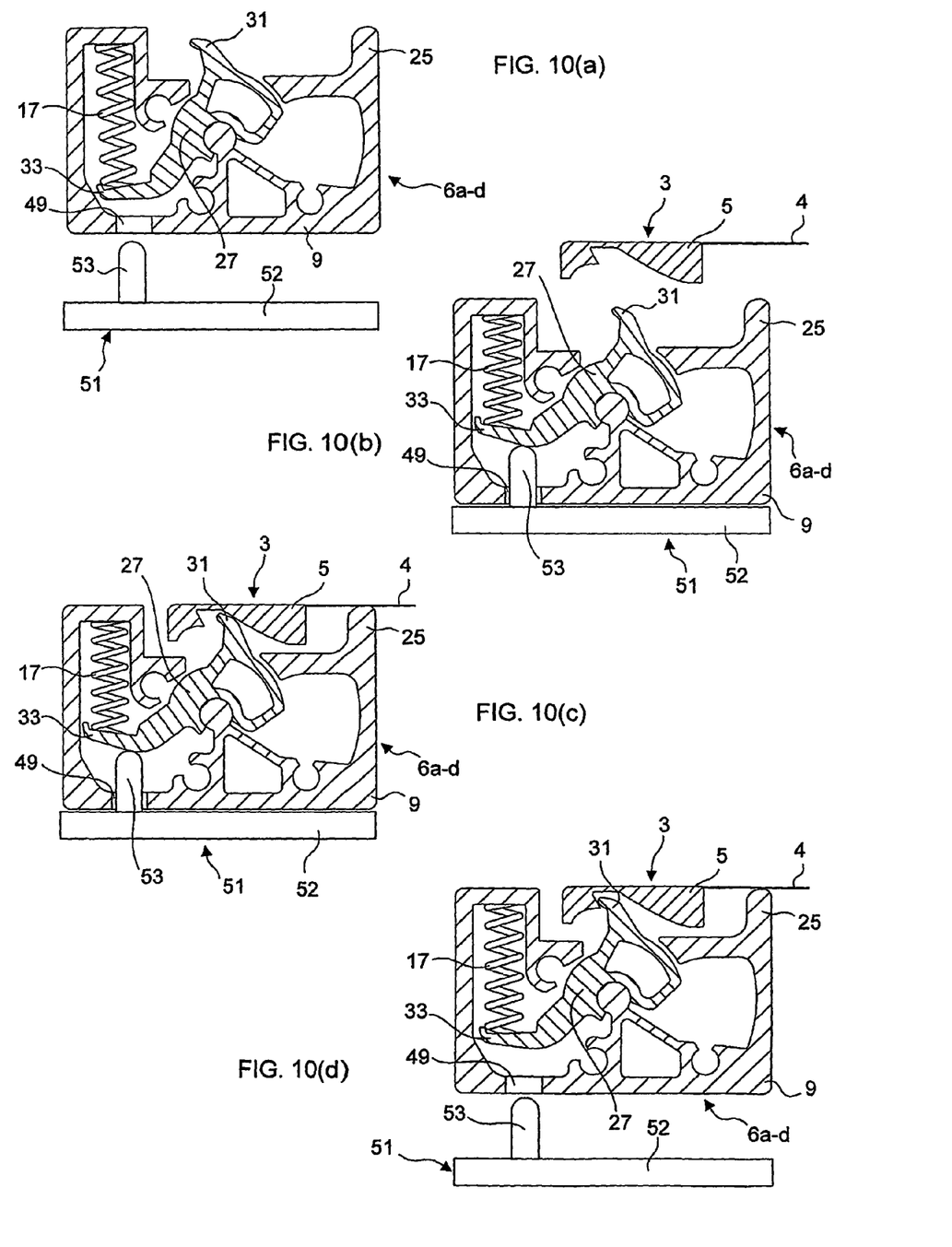
FIGS. 10(a) to (d) illustrate the operation of the frame unit of FIG. 8 when fitting a printing screen thereto.

From the normal, rest configuration of the frame unit 1, as illustrated in FIG. 10(a), the frame unit 1 is clamped to the jig 51, whereby the engagement members 53 engage the biasing arms 33 of respective ones of the engagement elements 11, such that the engagement members 53 pivot the engagement elements 11 against the biasing force of the biasing elements 17 to adopt a configuration in which the screen 3 can be fitted to the frame unit 1, as illustrated in FIG. 10(b).

As illustrated in FIG. 10(c), the screen 3 is then located in position on the frame unit 1, in this embodiment with the engagement members 5 at the edges of the screen 3 being located in the screen recesses 23 in the frame elements 9 of the respective frame members 6a-d.

Following the positioning of the screen 3, the frame unit 1 is unclamped from the jig 51, whereupon the engagement elements 11 are pivoted by the biasing force of the biasing elements 17 in the tensioning sense, such as to tension the respective edges of the screen 3, as illustrated in FIG. 10(d).

The removal of a printing screen 3 from the frame unit 1 will now be described hereinbelow with reference to FIGS. 11(a) to (d). In removing a printing screen 3 from the frame unit 1, the frame unit 1 is required to be inverted from its normal operational orient, and thus FIGS. 11(a) to (d) illustrate the frame unit 1 in the inverted state.

Figures 11A, 11B, 11C, 11D:
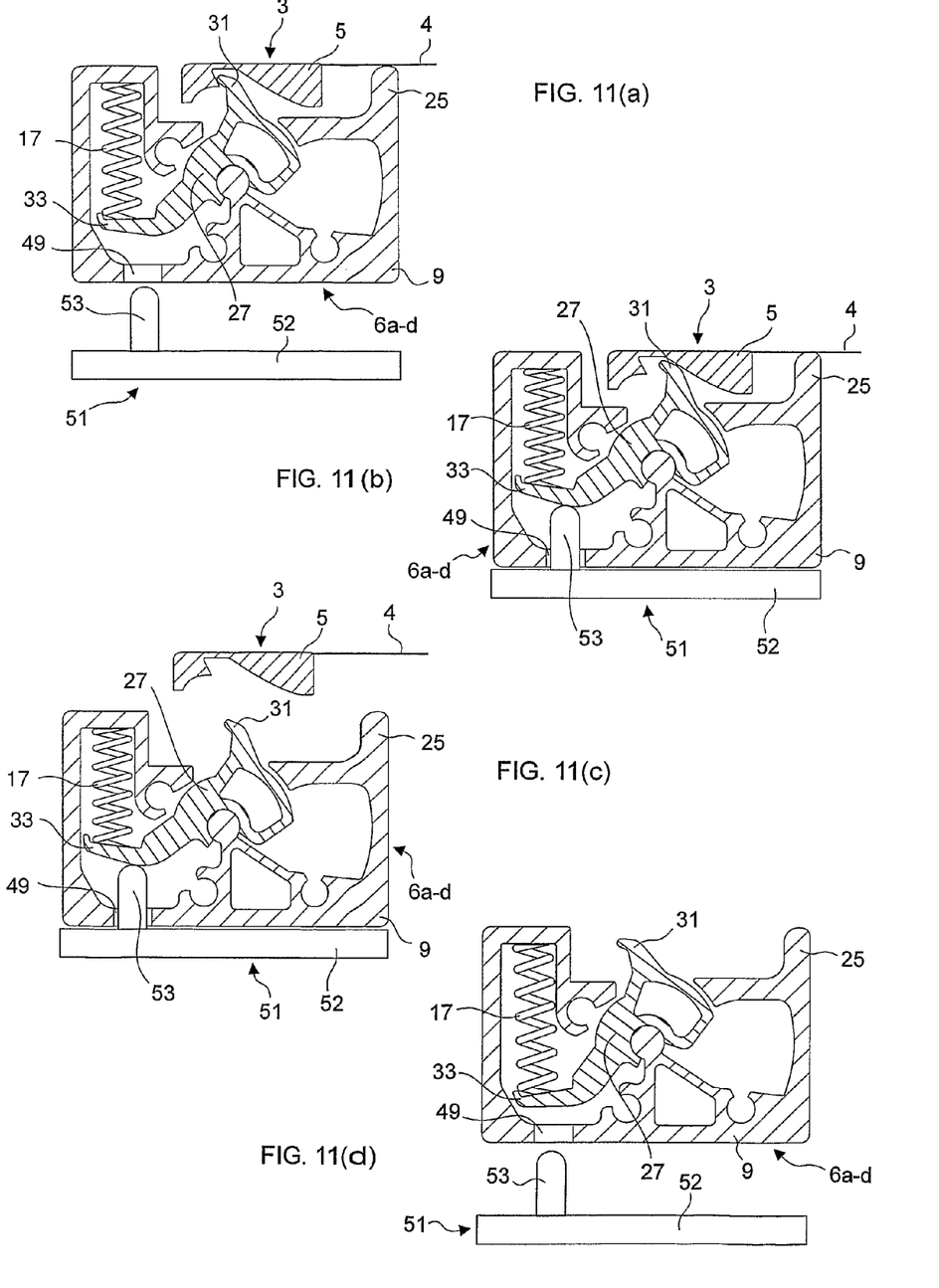
FIGS. 11(a) to (d) illustrate the operation of the frame unit of FIG. 8 when removing a printing screen therefrom.

From the fitted configuration in which a printing screen 3 is fitted to the frame unit 1, as illustrated in FIG. 11(a), the frame unit 1 is clamped to the jig 51, whereby the engagement members 53 engage the biasing arms 33 of respective ones of the engagement elements 11, such that the engagement members 53 pivot the engagement elements 11 against the biasing force of the biasing elements 17 to adopt a configuration in which the screen 3 can be removed from the frame unit 1, as illustrated in FIG. 11(b).

As illustrated in FIG. 11(c), the screen 3 is then removed from the frame unit 1.

Following removal of the screen 3, the frame unit 1 is unclamped from the jig 51, whereupon the engagement elements 11 are pivoted by the biasing force of the biasing elements 17 in the tensioning sense, such as to cause the engagement elements 11 to be pivoted by the biasing force of the biasing elements 17 to the normal, rest configuration, as illustrated in FIG. 11(d). Where another printing screen 3 is to be fitted to the frame unit 1, that printing screen 3 is located in position on the frame unit 1 in the manner described hereinabove before unclamping of the frame unit 1 from the jig 51.

Finally, it will be understood that the present invention has been described in its preferred embodiments and can be modified in many different ways without departing from the scope of the invention as defined by the appended claims.

In one alternative embodiment the frame members 6a-d could each include a single, elongate engagement element 11.

In other alternative embodiments the biasing elements 17 could be provided by any kind of resilient element, whether tensioned or compressed.

In yet another alternative embodiment the biasing elements 17 could be provided by actuatable elements, for example, an inflatable bladder of the kind as embodied in relation to the counter-biasing element 41.

Also, in the described embodiments the inflatable bladder 43 of the counter-biasing element 41 is pneumatically operated, but in other embodiments could be hydraulically operated.

The invention claimed is:

1. A frame unit for tensioning a printing screen, the frame unit comprising a frame including at least one frame member, the at least one frame member comprising:
a supporting frame element;
a plurality of engagement elements disposed along the supporting frame element for engaging a fitted printing screen to tension the same, wherein each engagement element comprises a body which is pivotally coupled to the supporting frame element such that the engagement element is pivotable in one, tensioning sense to tension the printing screen and the other, opposite sense to adopt a configuration in which the printing screen can be fitted to or removed from the frame unit, a first, engagement arm extending from the body for engaging the printing screen, and a second, biasing arm extending from the body to which a biasing force is applied to bias the engagement element to pivot in the tensioning sense, and each of the engagement elements is pivotable independently of the other; and
at least one biasing element operative to apply a biasing force to the biasing arm of the engagement elements to bias the engagement elements to pivot in the tensioning sense and tension the printing screen.

2. The frame unit of claim 1, wherein the supporting frame element comprises an extruded section.

3. The frame unit of claim 1, wherein the or each engagement element comprises an extruded section.

4. The frame unit of claim 1, wherein the supporting frame element includes a cavity along a length thereof in which the or each engagement element is disposed.

5. The frame unit of claim 1, wherein the supporting frame element includes a recess in a surface thereof into which the or each engagement element extends for receiving an engagement member at a respective edge of the printing screen.

6. The frame unit of claim 1, wherein the supporting frame element includes one of a pivot projection or a pivot recess extending along a length thereof and the or each engagement element includes the other of a pivot recess or a pivot projection extending along a length thereof which engages the one of the pivot projection or the pivot recess of the supporting frame element.

7. The frame unit of claim 1, wherein the supporting frame element includes one of a pivot projection or a pivot recess extending along a length thereof and the or each engagement element includes the other of a pivot recess or a pivot projection extending along a length thereof which engages the one of the pivot projection or the pivot recess of the supporting frame element, and the one of the pivot projection or the pivot recess of the supporting frame element and the other of the pivot recess or the pivot projection of the or each engagement element are captively engaged.

8. The frame unit of claim 1, wherein the at least one biasing element provides a permanent biasing force.

9. The frame unit of claim 1, wherein the at least one biasing element comprises a resilient element.

10. The frame unit of claim 1, wherein the at least one frame member comprises:
a plurality of biasing elements for biasing the or each engagement element.

11. The frame unit of claim 1, wherein the at least one frame member comprises:
a plurality of biasing elements for biasing the engagement elements, wherein each engagement element is biased by at least one biasing element.

12. The frame unit of claim 1, wherein the engagement elements are juxtaposed in end-to-end relation along a length of the supporting frame element.

13. The frame unit of claim 1, wherein the frame includes a mounting surface at which a respective edge of the printing screen is engaged.

14. The frame unit of claim 13, wherein the frame includes a mounting surface at which a respective edge of the printing screen is engaged, and the at least one biasing element is configured to apply a biasing force to the biasing arm of the or each engagement element in a direction substantially orthogonal to the mounting surface.

15. The frame unit of claim 13, wherein the frame includes a mounting surface at which a respective edge of the printing screen is engaged, and the engagement arm of the or each engagement element extends substantially orthogonally to the mounting surface.

16. The frame unit of claim 13, wherein the frame includes a mounting surface at which a respective edge of the printing screen is engaged, and the biasing arm of the or each engagement element has a principal component extending parallel to the mounting surface.

17. The frame unit of claim 1, wherein the frame includes a mounting surface at which a respective edge of the printing screen is engaged, and the biasing arm of the or each engagement element has a principal component extending parallel to the mounting surface and in a direction towards an outer edge of the supporting frame element.

18. The frame unit of claim 1, wherein the supporting frame element includes at least one aperture into which at least one engagement member can be inserted to engage the biasing arm of the or each engagement element to pivot the or each engagement element in the other sense to adopt a configuration in which the printing screen can be fitted to or removed from the frame unit.

19. The frame unit of claim 1, wherein the at least one frame member further comprises:
   a counter-biasing element operative to apply a counter-biasing force to the or each engagement element to overcome the biasing force of the at least one biasing element and pivot the or each engagement element in the other sense to adopt a configuration in which the printing screen can be fitted to or removed from the frame unit.

20. The frame unit of claim 1, wherein the at least one frame member further comprises:
   a counter-biasing element operative to apply a counter-biasing force to the or each engagement element to overcome the biasing force of the at least one biasing element and pivot the or each engagement element in the other sense to adopt a configuration in which the printing screen can be fitted to or removed from the frame unit, wherein the at least one counter-biasing element comprises an expandable member.

21. The frame unit of claim 1, wherein the at least one frame member further comprises:
   a counter-biasing element operative to apply a counter-biasing force to the or each engagement element to overcome the biasing force of the at least one biasing element and pivot the or each engagement element in the other sense to adopt a configuration in which the printing screen can be fitted to or removed from the frame unit, wherein the at least one counter-biasing element comprises an inflatable bladder.

22. The frame unit of claim 1, wherein the at least one frame member further comprises:
   a counter-biasing element operative to apply a counter-biasing force to the or each engagement element to overcome the biasing force of the at least one biasing element and pivot the or each engagement element in the other sense to adopt a configuration in which the printing screen can be fitted to or removed from the frame unit, wherein the at least one counter-biasing element is configured to apply a counter-biasing force to a side of the biasing arm of the or each engagement element opposite to which the biasing force is applied by the at least one biasing element.

23. The frame unit of claim 1, wherein the at least one frame member comprises an elongate member.

24. The frame unit of claim 1, wherein the frame is substantially rectangular in shape.

25. The frame unit of claim 1, wherein the frame includes a plurality of frame members.

26. The frame unit of claim 1, wherein the frame includes at least one pair of frame members disposed in opposed relation.

27. The frame unit of claim 1, wherein the frame comprises first and second pairs of frame members each disposed in opposed relation.

28. The frame unit of claim 1, wherein the frame comprises first and second pairs of frame members each disposed in opposed relation, and the respective ends of the frame members are connected by corner pieces.

29. The frame unit of claim 1, wherein the frame includes a plurality of frame members, and each frame member further comprises:
   a single counter-biasing element operative to apply a counter-biasing force to the or each engagement element to overcome the biasing force of the at least one biasing element and pivot the or each engagement element in the other sense to adopt a configuration in which the printing screen can be fitted to or removed from the frame unit.

30. In combination the frame unit of claim 1 and a printing screen.

31. The frame unit of claim 1, wherein the frame includes a mounting surface at which a respective edge of the printing screen is engaged, and the operating arm of the or each engagement element has a principal component extending parallel to the mounting surface and extends in a direction towards an inner edge of the supporting frame element.

32. The frame unit of claim 1, wherein the frame includes a mounting surface at which a respective edge of the printing screen is engaged, and the operating arm of the or each engagement element has a principal component extending parallel to the mounting surface.

33. A frame unit for tensioning a printing screen, the frame unit comprising a frame including at least one frame member, the at least one frame member comprising:
   a supporting frame element;
   at least one engagement element for engaging a fitted printing screen to tension the same, wherein the at least one engagement element comprises a body which is pivotally coupled to the supporting frame element such that the at least one engagement element is pivotable in one, tensioning sense to tension the printing screen and the other, opposite sense to adopt a configuration in which the printing screen can be fitted to or removed from the frame unit, a first, engagement arm extending from the body for engaging the printing screen, a second, biasing arm extending from the body to which a biasing force is applied to bias the at least one engagement element to pivot in the tensioning sense, and a third, operating arm to which a counter-biasing force is applied to overcome the biasing force applied to the biasing arm and pivot the at least one engagement element in the other sense to adopt a configuration in which the printing screen can be fitted to or removed from the frame unit;
   at least one biasing element operative to apply a biasing force to the biasing arm of the at least one engagement element to bias the at least one engagement element to pivot in the tensioning sense and tension the printing screen; and
   a counter-biasing element operative to apply a counter-biasing force to the operating arm of the at least one engagement element to overcome the biasing force of the at least one biasing element and pivot the at least one engagement element in the other sense to adopt a configuration in which the printing screen can be fitted to or removed from the frame unit.

34. The frame unit of claim 33, wherein the at least one frame member comprises:

a plurality of engagement elements disposed along a length of the supporting frame element, each pivotable independently of the other.

35. The frame unit of claim 33, wherein the frame includes a mounting surface at which a respective edge of the printing screen is engaged, and the operating arm of the at least one engagement element has a principal component extending parallel to the mounting surface.

36. The frame unit of claim 35, wherein the operating arm of the at least one engagement element extends in a direction towards an inner edge of the supporting frame element.

37. The frame unit of claim 33, wherein the at least one frame member comprises:
   a plurality of engagement elements disposed along a length of the supporting frame element, each pivotable independently of the other; and
   a plurality of biasing elements for biasing the engagement elements, wherein each engagement element is biased by at least one biasing element.

38. The frame unit of claim 33, wherein the at least one frame member comprises:
   a plurality of engagement elements disposed along a length of the supporting frame element, each pivotable independently of the other, and the engagement elements are juxtaposed in end-to-end relation along a length of the supporting frame element.

39. The frame unit of claim 33, wherein the at least one counter-biasing element comprises an expandable member.

40. The frame unit of claim 33, wherein the at least one counter-biasing element comprises an inflatable bladder.

41. The frame unit of claim 33, wherein the at least one counter-biasing element is configured to apply a counter-biasing force to a side of the biasing arm of the or each engagement element opposite to which the biasing force is applied by the at least one biasing element.

42. In combination a printing screen and a frame unit for tensioning the printing screen, the frame unit comprising a frame including a mounting surface at which a respective edge of the printing screen is engaged and at least one frame member, the at least one frame member comprising:
   a supporting frame element;
   at least one engagement element for engaging the printing screen to tension the same, wherein the at least one engagement element comprises a body which is pivotally coupled to the supporting frame element such that the at least one engagement element is pivotable in one, tensioning sense to tension the printing screen and the other, opposite sense to adopt a configuration in which the printing screen can be fitted to or removed from the frame unit, a first, engagement arm extending from the body for engaging the printing screen, and a second, biasing arm extending from the body to which a biasing force is applied to bias the at least one engagement element to pivot in the tensioning sense; and
   at least one biasing element operative to apply a biasing force to the biasing arm of the at least one engagement element to bias the at least one engagement element to pivot in the tensioning sense and tension the printing screen, wherein the at least one biasing element is configured to apply a biasing force to the biasing arm of the at least one engagement element in a direction substantially orthogonal to the mounting surface.

43. The printing screen and frame unit of claim 42, wherein the engagement arm of the or each engagement element extends substantially orthogonally to the mounting surface.

44. The printing screen and frame unit of claim 42, the biasing arm of the or each engagement element has a principal component extending parallel to the mounting surface.

45. The printing screen and frame unit of claim 42, wherein the biasing arm of the or each engagement element has a principal component extending parallel to the mounting surface and in a direction towards an outer edge of the supporting frame element.

46. The printing screen and frame unit of claim 42, wherein the operating arm of the or each engagement element has a principal component extending parallel to the mounting surface.

47. The printing screen and frame unit of claim 42, wherein the operating arm of the or each engagement element has a principal component extending parallel to the mounting surface and extends in a direction towards an inner edge of the supporting frame element.

48. In combination a printing screen and a frame unit for tensioning the printing screen, the frame unit comprising a frame including a mounting surface at which a respective edge of the printing screen is engaged and at least one frame member, the at least one frame member comprising:
   a supporting frame element;
   at least one engagement element for engaging the printing screen to tension the same, wherein the at least one engagement element comprises a body which is pivotally coupled to the supporting frame element such that the at least one engagement element is pivotable in one, tensioning sense to tension the printing screen and the other, opposite sense to adopt a configuration in which the printing screen can be fitted to or removed from the frame unit, a first, engagement arm extending from the body for engaging the printing screen, and a second, biasing arm extending from the body to which a biasing force is applied to bias the at least one engagement element to pivot in the tensioning sense, with the biasing arm of the at least one engagement element having a principal component extending parallel to the mounting surface; and
   at least one biasing element operative to apply a biasing force to the biasing arm of the at least one engagement element to bias the at least one engagement element to pivot in the tensioning sense and tension the printing screen.

49. The printing screen and frame unit of claim 48, wherein the at least one biasing element is configured to apply a biasing force to the biasing arm of the or each engagement element in a direction substantially orthogonal to the mounting surface.

* * * * *

UNITED STATES PATENT AND TRADEMARK OFFICE
CERTIFICATE OF CORRECTION

PATENT NO. : 8,430,027 B2  
APPLICATION NO. : 10/595704  
DATED : April 30, 2013  
INVENTOR(S) : Shaw et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1414 days.

Signed and Sealed this
Eighth Day of September, 2015

Michelle K. Lee
*Director of the United States Patent and Trademark Office*